United States Patent

Tanaka

[11] Patent Number: 6,050,830
[45] Date of Patent: Apr. 18, 2000

[54] TAPE CARRIER PACKAGE FOR LIQUID CRYSTAL DISPLAY

[75] Inventor: Shinichi Tanaka, Niihari-mura, Japan

[73] Assignee: Texas Instruments Incorporated, Dallas, Tex.

[21] Appl. No.: 08/947,301

[22] Filed: Oct. 8, 1997

[30] Foreign Application Priority Data

Oct. 11, 1996 [JP] Japan ................................ 8-289181

[51] Int. Cl.⁷ ................................................ H01R 9/09
[52] U.S. Cl. ................................................ 439/67
[58] Field of Search ....................... 439/590, 67; 361/749

[56] References Cited

U.S. PATENT DOCUMENTS

| | | | |
|---|---|---|---|
| 4,636,019 | 1/1987 | Gillett | 439/260 |
| 5,598,627 | 2/1997 | Saka et al. | 439/67 |
| 5,610,642 | 3/1997 | Nobel et al. | 439/67 |

*Primary Examiner*—Neil Abrams
*Assistant Examiner*—T C Patel

*Attorney, Agent, or Firm*—William B. Kempler; Richard L. Donaldson

[57] ABSTRACT

A tape carrier package having many pins with a fine pitch can be simultaneously attained through a simplified positioning during the connection to external devices. Leads (4) and (5) are formed from an over coat area (3), which is formed at the central area of a base film (2), which is made of a resin, such as polymide, for example. Furthermore, outer leads (4a) at the input side and outer leads (5a) at the output side are respectively formed in a manner so that they extend towards both edge areas of the base film (2). A notched section 6 is formed between the outer leads (5a) at the output side of the base film (2), and through this, each of the regions (2a) and (2b) expands independently during a thermocompression bonding. The notched section 6 is provided almost at the central area of the base film (2) in the longitudinal direction, and outer leads (5) at the output side in the same number (256 for example) are formed at both of its sides in a pitch of approximately 70 μm. A reinforcing device (13) is provided across the notch.

21 Claims, 3 Drawing Sheets

TAPE CARRIER PACKAGE FOR LIQUID CRYSTAL DISPLAY

FIELD OF THE INVENTION

This invention concerns a tape carrier package onto which a driver IC chip, which drives the display panel of a liquid crystal display device (LCD), for example, is loaded and the display panel and an external device are electrically connected through the said driver IC.

BACKGROUND OF THE INVENTION

TCP (Tape Carrier Package) has been used as a measure for electrically connecting between a LCD display panel, for example, and an external device, for example, through a driver IC chip.

FIG. 5 illustrates the overall structure of the existing TCP.

As shown in FIG. 5, this TCP 101 has a device hole 112, which is opened in an area slightly larger than the driver IC chip 111, at the central part of the base film 102, which is made of a resin, such as polymide, for example, and it has multiple leads 104, which are connected to an external device, and multiple leads 105, which are connected to an LCD display panel. The driver IC chip 111, with the inner lead of each of the leads 4 and 5 connected to an electrode pad (not shown in the figure) that is formed over the said IC chip 111, is installed at the device hole 112. Furthermore, the driver IC chip 111 as well as the device hole 112 are sealed with a resin, which forms an overcoat area 103.

Multiple outer leads 104A at the input side of the leads 104 and outer leads 105A at the output side of the leads 105 are formed adjacent to each other.

With advancements in the attainment of fine pitch and the many pins for the external leads 105A at the output side that accompany high resolution in liquid crystal panels in recent years, this type of TCP is often connected to connecting terminals of a LCD display panel by an anisotropic conductive adhesive film (ACF) that contains conductive particles in a binding resin.

FIG. 6 illustrates a process in which a TCP 101 is mounted onto a LCD display panel by using an anisotropic conductive adhesive film.

As shown in FIG. 6, an anisotropic conductive adhesive film, which is not shown in the figure, is held between a lower glass panel 106 and the connection region 102A at the output side of the base film 102 of the TCP 101, and a thermocompression bonding heating tool 108 is pressed from above the upper glass panel 107. As a result, the base film 102 of the TCP 101 is bonded to the lower glass panel 106 by the binding resin in the anisotropic conductive adhesive film, and the outer lead 105A at the output side of the TCP 101 is also connected to the electrode pattern of the lower glass panel 106 by the conductive particles within the anisotropic conductive adhesive film at the same time.

On the other hand, the pitch of the outer lead 104A at the output side of the TCP 101 is larger than that of the outer lead 105A at the output side, therefore, it is generally connected to a printed substrate, for example, by soldering.

However, demands for attaining fine pitches and many pins particularly at the outer lead 105A of the output side of the TCP 101 have been increasing in recent years. Reasons for this include, for example: an attempt to reduce cost by decreasing the number of parts in the connection of the LCD display panel, and a reduction in cost for a driver per channel. As a result, one that has a pitch among the outer leads 105A at the output side at 70 $\mu$m and 240 channels, and one that has the said pitch at 110 $\mu$m and 309 channels, for example, have been put into practical use in recent years.

However, the base film 102 is thermally expanded during the thermocompression bonding described above in the existing TCP 101, the position of the outer lead 105 at the output side is shifted, and positioning between the outer lead 105 and the electrode pattern 109 over the glass panel 106 becomes difficult as with difficulty in obtaining more pins.

For example, in the TCP 101 shown in FIG. 5, the base film 102 during a thermocompression bonding expands in directions that spread out towards both sides (directions of the arrows), the outer leads 105A at the output side at both edge areas in particular are significantly shifted, and as a result, positioning with the electrode pattern 109 over the glass panel 106 becomes difficult. Additionally, there is the problem of positioning becoming more difficult when an attempt is made to obtain many pins by narrowing the pitch among the outer leads 105A.

The aim of this invention, which was made to solving said problem in the existing technology, is to offer a tape carrier package which has easy positioning during the connection to an external device so that many pins and a fine pitch can be simultaneously attained.

SUMMARY OF THE INVENTION

It is a general object of the invention to provide a tape carrier package having multiple connection terminals.

It is a further object of the invention to provide a tape carrier package for a LCD display.

These and other objects of the invention are attained, in accordance with one aspect of the invention by a tape carrier package having a first set of multiple connection terminals on a base film along one side of the tape carrier package for connecting to an external device. The tape carrier package has a base film having a conducting metal film thereon which is divided into a plurality of sections of multiple connection terminals by at least one notch in the base film along the one side of the tape carrier package. A reinforcing device is across the notch in a direction of the multiple connection terminals. The reinforcing device is made of a conductive film.

Another aspect of the invention is provided by a LCD display in which a LCD is mounted to a tape carrier package. A notch is cut into a base film of the tape carrier package at a side of the tape carrier package having an output connector connected to said LCD. The notch divides the output connector into a plurality of sections each having at least one terminal. A reinforcing device is across the notch at edge areas of the notch that face each other; the reinforcing device being made of a conductive film.

REFERENCE NUMERALS AS SHOWN IN THE DRAWINGS

1 represents a tape carrier package (TCP), 2 base film, 2a, 2b regions, 3 overcoat area, 4-lead, 4a outer lead on the input side, 5 lead, 5a outer lead at the output side, 6 notched section, 8, 10 dummy leads, 11 driver IC chip, 12 device hole, and 13 copper foil.

DESCRIPTION OF THE EMBODIMENTS

Ideal embodiments of the tape carrier package by this invention will be explained in detail by referring to the figures below.

Figure 1:
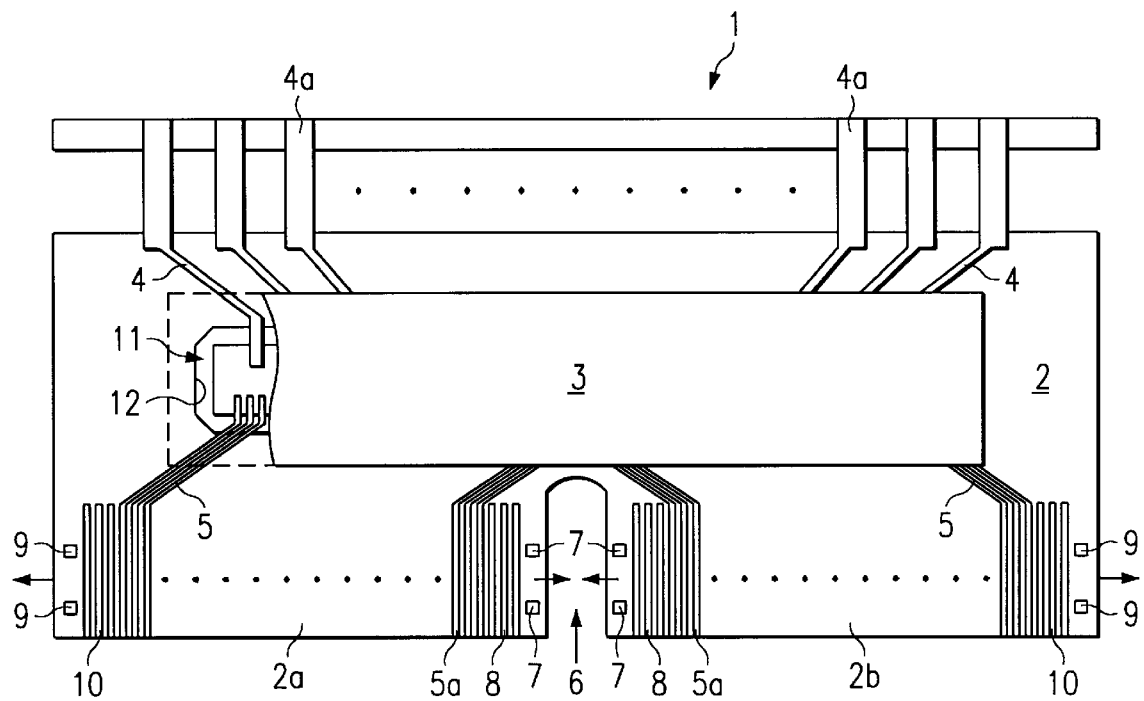
FIG. 1 is a plan view illustrates the overall structure of an ideal embodiment of a tape carrier package by this invention.

FIG. 1 is a top view which illustrates the overall structure of the tape carrier package equipped with an LCD display panel driving driver IC in the form of this implementation.

A TCP 1 shown in FIG. 1 illustrates a condition where it is cut off for mounting, and parts that are not directly related to this invention, such as a hole through which a jig is inserted, and a solder resist, for example, are omitted in the illustration.

As shown in FIG. 1, the form of this embodiment has a device hole 12, which is opened in an area slightly larger than the driver IC chip 11, at the central area of the base film 2, which is made of a resin, such as polymide, for example, in a thickness of approximately 75 μm, and has multiple leads 4, which are connected to external devices, and multiple leads 5, which are connected to the LCD display panel. The driver chip 11, with each of the leads 4 and 5 connected to the electrode pad that is formed over the said IC chip 11, is installed at the device hole 12. Furthermore, the driver IC chip 11 and the device hole 12 are sealed with a resin, and this forms an overcoat area 3.

Outer leads 4a at the output side of the leads 4 and outer leads 5a at the output side of the leads 5 are respectively formed in a manner so that they extend towards both edge areas of the base film 2. These leads 4 and leads 5 are formed by etching copper foil, for example, and the respective outer leads 4a and 5a and connection areas that are adjacent are arranged in parallel at both edge areas of the base film 2.

The leads 4 and leads 5 are formed to a thickness of approximately 18 μm.

Figure 2:
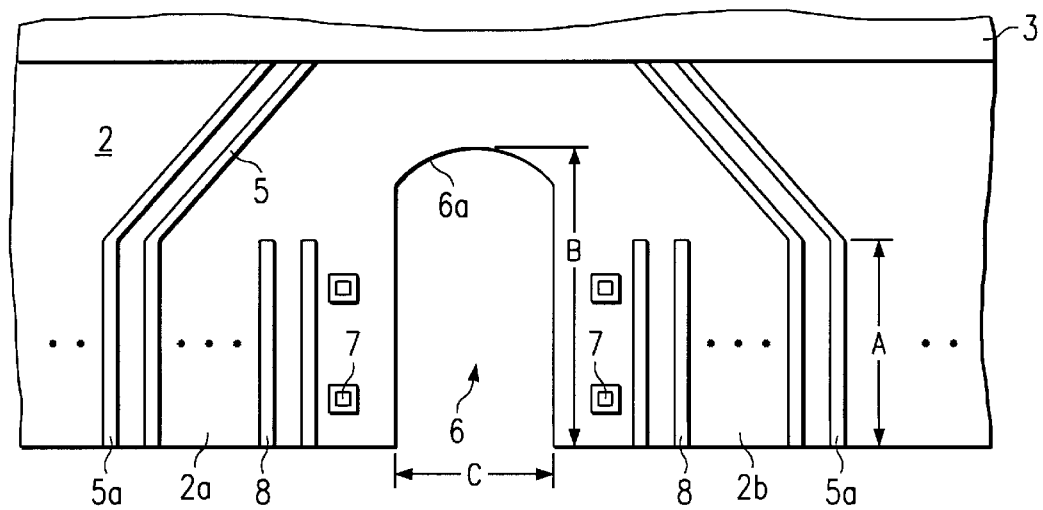
FIG. 2 is an enlarged plan view which illustrates an area near the notched section in the same embodiment.

As shown in FIG. 1, in this embodiment, a notched section 6 is formed between the outer leads 5a at the output side at the edge area of the side where the outer leads 5a at the output side are formed in the base film 2. This notched section 6 is provided almost at the central area of the base film 2 in the longitudinal direction, and as shown in FIG. 2, it is formed in a manner so that it becomes parallel to the area in the outer lead 5a at the output side that is connected to the electrode of the display panel, which is not shown in the figure.

In the case of this embodiment, outer leads 5a at the output side in the same number (256 for example) are formed in a pitch of approximately 70 μm at both sides of the notched section 6.

Alignment marks 7 for positioning are provided near the notched section 6 at both sides.

Also, several dummy leads 8 are provided between the outer leads 5a at the output side and the alignment marks 7.

On the other hand, the same alignment marks 9 as mentioned above are provided at both edge areas of the base film 2 in the longitudinal direction. Furthermore, several of the same aforementioned dummy leads 10 are also formed between these alignment marks 9 and the outer leads 5a at the output side.

FIG. 2 illustrates an area near the notched section 6 in this embodiment.

As shown in FIG. 2, the notched section 6 is cut slightly longer than the length of the area to be connected, where the outer leads 5a on the output side are formed in a manner so that they are adjacent to each other and extend in parallel, and it is formed in a manner so that its back part 6a forms a circular shape.

With respect to the size of the notched section 6, when the length A of the area of the outer lead 5a that is to be connected at the output side is approximately 1–2 mm, the ideal length B of the notched section 6 is approximately 2–4 mm.

The ideal width C of the notched section 6 is approximately 1.5 mm.

When the TCP 1 in this embodiment with such a structure is heated and pressure is applied for a thermocompression bonding onto a LCD display panel, the base film 2 stretches through thermal expansion, however, because the notched section 6 is formed between the outer leads 5a at the output side in this embodiment, regions 2a and 2b in the base film 2, which are positioned at areas at both of its sides, independently expand, and they respectively stretch in the left and right directions in the figure, as shown in FIG. 1.

In this case, the amount each of the regions 2a and 2b in the base film 2 stretches is smaller than the total stretching amount of the base film 2 in the longitudinal direction, therefore, the shifting amount of the outer leads 5a at the output side, which are formed at each of the regions 2a and 2b, becomes smaller when compared to a case without a notched section 6. In the case of this embodiment, outer leads 5 at the output side in the same number are formed at both sides of the notched section 6, therefore, the dislocation among the outer leads 5 at the output side becomes approximately ½ when compared to a case without the notched section 6.

Accordingly, in this embodiment, easy positioning with the electrode pattern of the LCD display panel can be obtained even when the number of outer leads 5a at the output side is increased and its pitch is made small as well, through which a fine pitch and many pins can be simultaneously attained.

As a result, the number of parts in the driver IC that are used in the LCD display panel can be decreased if the TCP 1 in this embodiment is used, and it becomes possible to attain a reduction in cost of the LCD.

Figure 3:
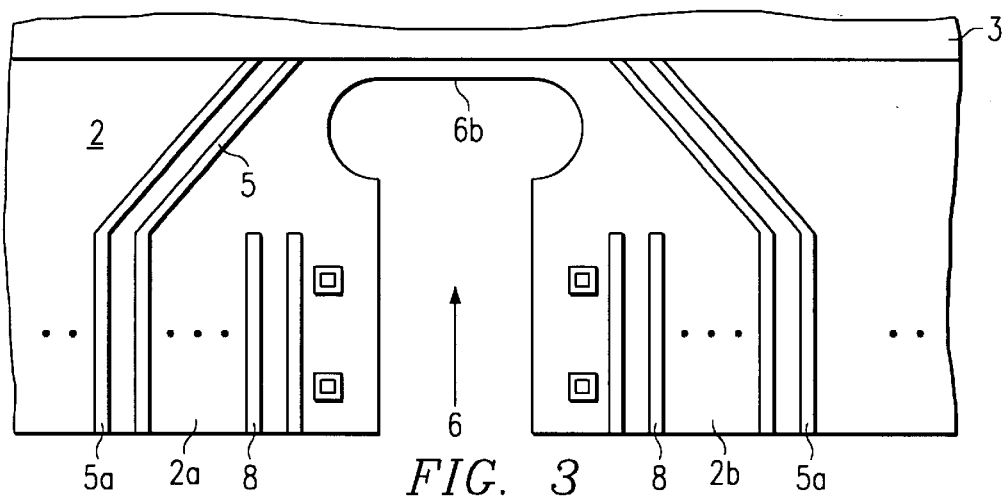
FIG. 3 is an enlarged plan view which illustrates a major part in another embodiment by this invention.

FIG. 3 illustrates a major part of another embodiment of this invention, and parts that correspond to the embodiment described above will have the same numbers attached and explained below.

As shown in FIG. 3, the back area 6b of the notched section 6 is cut significantly to the left and right in this embodiment when compared to the embodiment for described above.

In this embodiment with such a structure, the respective regions 2a and 2b of the base film 2, which are positioned at both sides of the notched section 6, easily expand independently, and there is the effect of further simplifying the positioning of the outer leads 5 at the output side. The rest of the structure and its interactive effect are the same as the embodiment described above, and a detailed explanation of them will be omitted.

Figure 4:
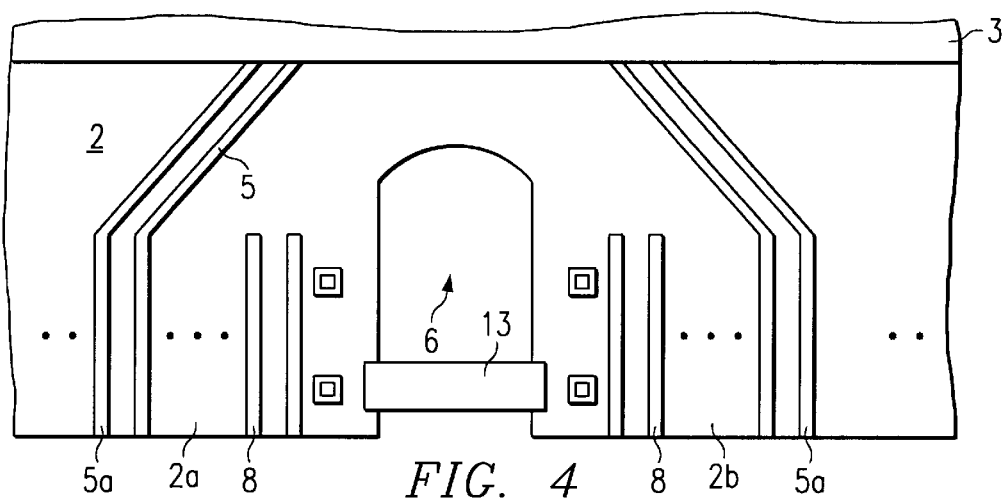
FIG. 4 is an enlarged plan view which illustrates a major part in another embodiment by this invention.
Figure 5:
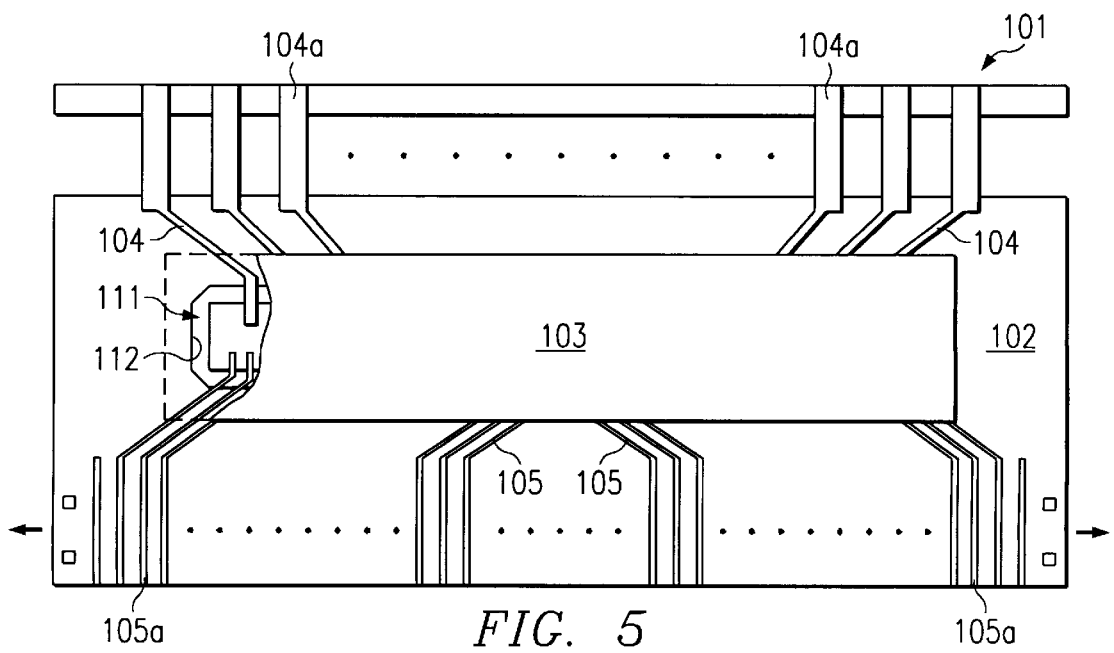
FIG. 5 is a plan view which illustrates the overall structure of the existing tape carrier package.
Figure 6:
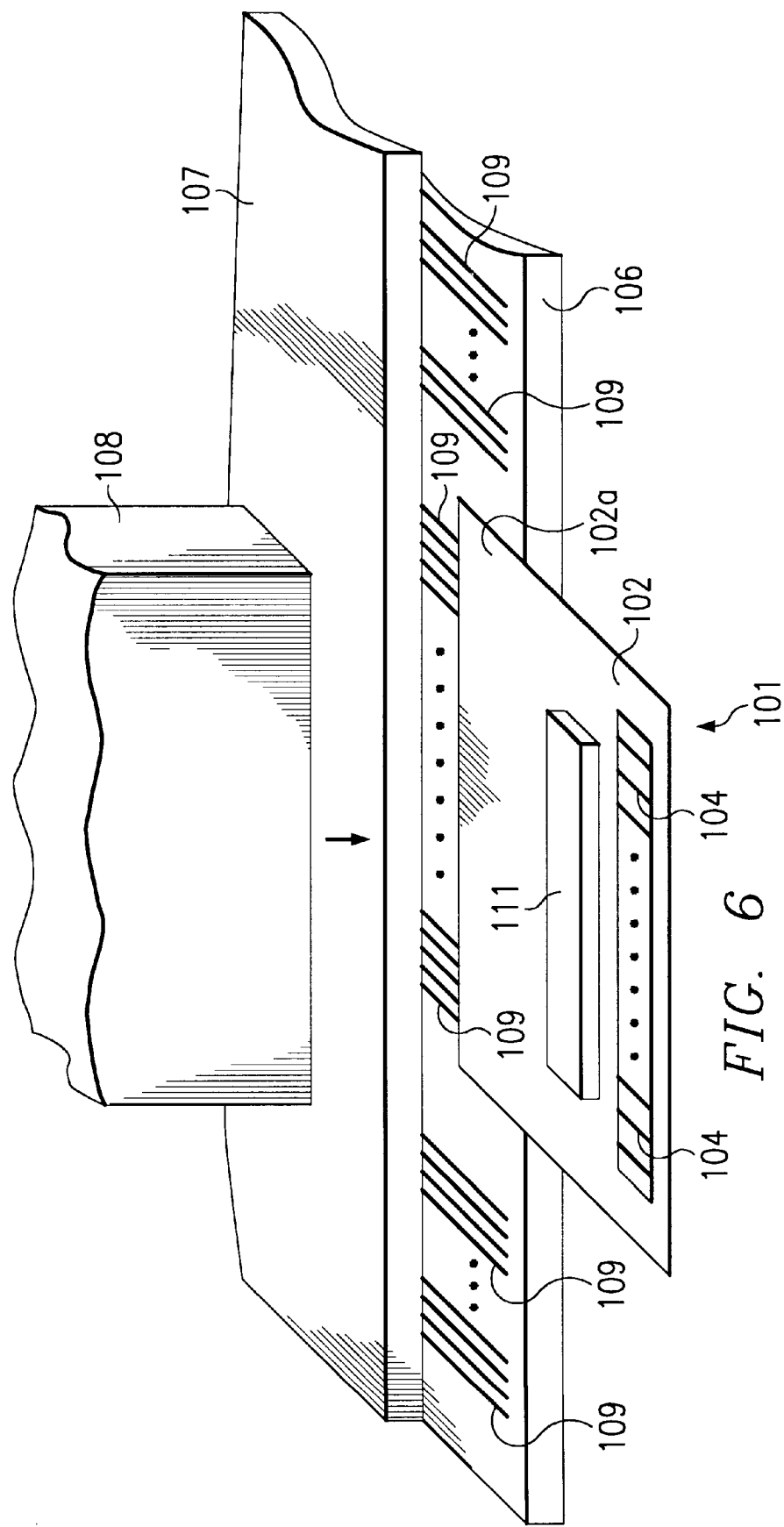
FIG. 6 is an explanatory diagram which illustrates a process in which a tape carrier package is mounted onto an LCD display panel by using an anisotropic conductive adhesive film.

FIG. 4 illustrates a major part of another embodiment of this invention. Parts that correspond to the embodiment described above will have the same numbers attached and explained below.

As shown in FIG. 4, in this embodiment, a copper foil in a long quadrangular shape 13 is laid across at the edge areas that face each other in the notched section 6 as a reinforcing device. It is ideal for this copper foil 13 to have the same thickness as the lead 5 and also a width of approximately 0.5 mm. The copper foil 13 can be easily obtained through simultaneous etching during the formation of the leads 4 and 5.

Curling up of the base film 2 near the notched section 6 can be prevented in this embodiment with such a structure, and the effect is that mounting on the LCD display panel is simplified.

On the other hand, multiple copper foils 13 may be formed at the opposing edge areas that face each other in the notched section 6, and curling up of the base film 2 can be further prevented in that case. The rest of the structure and its interactive effect are the same as the embodiment described above, and a detailed explanation will be omitted.

This invention should not be limited only to the embodiments described above, and many variations can be obtained.

For example, the connection region was divided into multiple regions through the provision of the notched section in the embodiment described above, however, this invention should not be limited only to this, and it is also possible to divide this into multiple regions by bonding multiple base films. However, the connection region can be most easily divided into multiple regions through the provision of the notched section in the embodiment described above.

Also, the shape of the notched section is not limited only to the embodiments described above, and it can take on various shapes. However, it is necessary to have a shape in which each connection region expands independently.

Furthermore, one notched section was provided in the embodiments described above. However, 2 or more may be provided. In such cases, the stretching in each connection region during thermocompression bonding becomes small, and the dislocation among the outer leads also becomes small. As a result, positioning with the LCD display panel becomes easier, and a further attainment of fine pitches and many pins can be attained.

Furthermore, the number of the outer leads that are provided at both sides of the notched section may not necessarily be the same. However, the stretching in each connection region during thermocompression bonding can be made equal when the same number of outer leads are provided on both sides of the notched section; when the pitch among the outer leads is uniform, positioning with the LCD display panel becomes easier, and further attainment of fine pitches and many pins can be obtained.

Additionally, the case in which the notched section was provided between the outer leads at the output side was used and explained as an example in the embodiment described above, but it is also possible for the notched section to be provided between the outer leads at the input side.

Additionally, this invention can certainly be applied not only to TCP for driver IC of LCD display panels but also to various other kinds of TCP.

As described above, in the invention described in claim 1 of the tape carrier package, in which multiple connection terminals are provided over the base film to be connected with external devices, the connection region in this base film is divided into multiple regions so that they expand independently, and the aforementioned connection terminals are arranged adjacent to each other in each of these regions. As a result, easy positioning with the electrode pattern of the LCD display panel, for example, can be obtained even when the number of connection terminals is increased, and its pitch is made small as well. Through this, fine pitches and many pins can be simultaneously attained.

As in the invention described in claim 2, the connection region can be divided into multiple regions in a simplified process in this case by providing a notched section between the connection terminals that are arranged adjacent with each other in the connection region of the base film in the invention described in claim 1.

As in the invention described in claim 3, the amount the connection terminals shift can be made small, and fine pitches and many pins can be attained by providing multiple notched sections in the invention described in claim 2.

Furthermore, as in the invention described in claim 4, fine pitches and many pins can be attained by providing the same number of connection terminals at both sides of the notched section in the invention described in either claim 2 or 3, and through which, the stretching in the connection regions at both sides of the notched section during heating or application of pressure can be made equal.

Furthermore, as in the invention described in claim 5, curling up of the base film during heating and application of pressure can be prevented, and an attempt can be made to simplify the mounting operation by laying a reinforcing device across at the edge areas that face each other at the notched section of the base film in the invention described in any one of claims 2–4.

I claim:

1. A tape carrier package having a first set of multiple connection terminals on a base film along one side of said tape carrier package, said multiple connection terminals for connecting to an external device, comprising:
   a base film having a conductive metal film thereon, said base film being divided into a plurality of sections at said multiple connection terminals by at least one notch in said base film along said one side of said tape carrier package;
   a reinforcing device extending across said notch in a direction of said multiple connection terminals, said reinforcing device being made of a conductive film.

2. The tape carrier package of claim 1 wherein said reinforcing device is made from the same conductive film used to form said first set of multiple connection terminals.

3. The tape carrier of claim 1 wherein said notch is longer in a direction substantially perpendicular to said one side of said tape carrier than a length of said first set of multiple connection terminals.

4. The tape carrier package of claim 1 wherein said notch terminates in an oblong shaped area distal from said one side of said tape carrier package.

5. The tape carrier package of claim 1 wherein dummy leads are placed adjacent said notch on both sides thereof.

6. The tape carrier package of claim 1 further comprising a second set of multiple connection terminals, one of said sets of multiple connection terminals for receiving an input signal and the other for coupling an output signal to said external device.

7. The tape carrier package of claim 6 further comprising an integrated circuit mounted on said package and coupled to said first and said second sets of multiple connection terminals.

8. The tape carrier package of claim 1 wherein said external device is a LCD display.

9. The tape carrier package of claim 8 wherein said LCD display is thermocompression bonded to said tape carrier package.

10. The tape carrier package of claim 2 wherein said conductive film is copper.

11. The tape carrier package of claim 9 wherein said conductive film is copper.

12. In a LCD display in which a LCD is mounted to a tape carrier package, the improvement comprising:

a notch cut into a base film of said tape carrier package at a side of said tape carrier package having an output connector connected to said LCD, said notch dividing said output connector into a plurality of sections each having at least one terminal; and a reinforcing device extending across said notch at edge areas of said notch that face each other, said reinforcing device being made of a conductive film.

13. The LCD display of claim 12 wherein said reinforcing device is made of a same conducting film used to make said output connector.

14. The LCD display of claim 12 wherein said LCD is thermocompression bonded to said tape carrier package.

15. The LCD display of claim 12 wherein said notch is longer in a direction substantially perpendicular to a longitudinal direction of said output connector than contact terminals of said output connector.

16. The LCD display of claim 12 wherein said notch terminals in an oblong shaped area distal from the end of said notch at said output connector.

17. The LCD display of claim 12 wherein dummy leads are placed adjacent said notch on both sides thereof.

18. The LCD display of claim 12 further comprising an input connector on said tape carrier package and an integrated circuit mounted on said tape carrier package and interposed between said input connector and said output connector.

19. The LCD display of claim 12 wherein said tape carrier is formed of a copper film over an insulator.

20. The LCD display of claim 13 wherein said conducting film is copper.

21. A LCD display comprising:

a tape carrier package having copper foil thereon, said copper foil being patterned into an input connector, an output connector and a mounting for an integrated circuit therebetween; a LCD thermocompression bonded to said output connector;

a notch cut into said base film of said tape carrier at said output connector, said notch dividing said output connector into a plurality of sections each having at least one terminal; and a reinforcing device made from said copper film and being across said notch at edge areas of said notch that face each other.

* * * * *